United States Patent
Tonti et al.

(10) Patent No.: US 6,177,809 B1
(45) Date of Patent: Jan. 23, 2001

(54) REDUNDANT INPUT/OUTPUT DRIVER CIRCUIT

(75) Inventors: William R. Tonti, Essex Junction, VT (US); Jack A. Mandelman, Stormville, NY (US); Anthony R. Bonaccio, Shelburne, VT (US); Claude L. Bertin, South Burlington, VT (US); Howard L. Kalter, Colchester, VT (US); John A. Fifield, Underhill, VT (US)

(73) Assignee: International Business Machines Corporation, Armonk, NY (US)

( * ) Notice: Under 35 U.S.C. 154(b), the term of this patent shall be extended for 0 days.

(21) Appl. No.: 09/322,470

(22) Filed: May 28, 1999

(51) Int. Cl.[7] .................................................. H03K 19/094
(52) U.S. Cl. ............................. 326/83; 326/87; 327/108; 327/109
(58) Field of Search .................................. 326/26, 27, 82, 326/83, 86, 87; 327/109, 108, 379, 384, 389

(56) References Cited

U.S. PATENT DOCUMENTS

| | | | |
|---|---|---|---|
| 4,855,623 | * | 8/1989 | Flaherty ................................. 307/475 |
| 5,153,450 | * | 10/1992 | Ruetz ..................................... 307/443 |
| 5,486,782 | * | 1/1996 | Chan ..................................... 327/112 |
| 5,498,977 | * | 3/1996 | Pickup .................................... 326/31 |
| 5,917,340 | * | 6/1999 | Manohar et al. ....................... 326/82 |
| 5,994,922 | * | 11/1999 | Aoki et al. ............................. 326/87 |

* cited by examiner

Primary Examiner—Son Mai
(74) Attorney, Agent, or Firm—John J. Goodwin

(57) ABSTRACT

A first, "known good" reference off-chip driver circuit actuated by an initial logic program (IPL) input signal has an output lead connected as one of the inputs to a comparator circuit for providing a reference off-chip driver output signal. A second off-chip driver circuit including a plurality of "n" separate driver circuit paths connected to input signal and produces output signals connected to a common node to provide output driver signals to the common node. The common node is connected to the second input of the comparator circuit for comparison with the reference off-chip driver output signal from the first off-chip driver circuit to determine the operating state of the second off-chip driver circuit with respect to the operating state of the first off-chip driver circuit.

7 Claims, 6 Drawing Sheets

REDUNDANT INPUT/OUTPUT DRIVER CIRCUIT

BACKGROUND OF THE INVENTION

1. Field Of The Invention

The present invention relates to semiconductor integrated circuits, and more particularly to input/output driver circuits for integrated circuits.

2. Background Art

U.S. Pat. No. 4,855,623 issued Aug. 8, 1989 to Flaherty entitled OUTPUT BUFFER HAVING PROGRAMMABLE DRIVE CIRCUIT discloses an output buffer circuit for providing selected output driving characteristics. A plurality of input terminals receive control and data signals and are connected to an output terminal through a plurality of interconnected driver transistors. Drive selector circuitry is responsive to control signals to selectively vary the connections of the driver transistors to the output terminal.

U.S. Pat. No. 5,153,450 issued Oct. 6, 1992 to Ruetz entitled PROGRAMMABLE OUTPUT DRIVE CIRCUIT discloses a programmable output driver circuit having multiple drive capabilities for optimizing noise margins at different frequencies. The circuit includes a plurality of signal paths in parallel, each comprising a driver unit having a pull-down and pull-up transistor. During operation, selected signal paths are disabled to reduce noise at lower frequencies.

U.S. Pat. No. 5,486,782 issued Jan. 23, 1996 to Chan entitled TRANSMISSION LINE OUTPUT DRIVER discloses a push-pull output driver circuit that includes a pair of low current output circuits connected in parallel with a pair of high current series connected devices. In response to a pulse transition at the driver circuit input, one of the high current devices is turned on to change the state of the output signal. When the output signal has reached a steady state, a low current device is turned on and the high current device is turned off such that the low current maintains the output signal state.

U.S. Pat. No. 5,498,977 issued Mar. 12, 1996 to Pickup entitled OUTPUT DRIVER HAVING PROCESS, VOLTAGE AND TEMPERATURE COMPENSATION FOR DELAY AND RISETIME discloses a chip wherein the effects of Process, supply Voltage and Temperature (PVT) variables are minimized by a table of predrive gain used to compensate for the effect of the PVT variables.

SUMMARY OF THE INVENTION

An object of the present invention is to provide improved input/output (I/O) circuitry that provides appropriate driver strength for an off-chip driver (OCD) circuit.

Another object of the present invention is to provide an improved I/O circuit that provides driver strength as a function of driving load or changing operating conditions such as power supply, or circuit degradation.

Still another object of the present invention is to provide an improved I/O circuit that continuously monitors OCD circuit operating conditions over time and optimizes the power/performance circuit factor.

Other objects, features, advantages and benefits of the present invention will become apparent in the following description taken in conjunction with the following drawings. It is to be understood that the foregoing general description and the following detailed description are exemplary and explanatory but are not to be restrictive of the invention.

The accompanying drawings which are incorporated in and constitute a part of this invention and, together with the description, serve to explain the principles of the invention in general terms. Like numerals refer to like parts throughout the disclosure.

DESCRIPTION OF THE INVENTION

Off-chip drivers (OCD) are devices that are employed in integrated circuits to drive data represented by 1's and 0's onto external buses within determined performance goals, without generating significant noise.

Performance is typically measured as a slew rate, which is the rate of change in voltage with time (Dv/Dt) at a certain load capacitance or output impedance. Noise is typically measured as the rate of change of output driver current with time (Di/Dt), which in turn creates changes in voltages internal to the chip and/or voltage variations such as undershoot and undershoot on the bus that the OCD is driving. Consequently, it is necessary to maximize OCD performance, (i.e. Dv/Dt), and also minimize noise generation (i.e. Di/Dt).

I/O circuitry for OCD drivers can be provided in a multitude of driver strength configurations to match the correct off chip loading criterion. A design decision must be made between two choices; a custom circuit design for every OCD application, or a compromised single circuit design for all OCD applications. For example, an OCD may be designed for the worst case load, which provides adequate performance for all cases, but limits the application from a low power laptop.

Various embodiments of the present invention are provided which will automatically adjust the driver strength based on load and or operating condition degradation.

The first embodiment of the invention is one wherein the system is enabled by Initial Program Logic (IPL) mode at any time. IPL modes are power on test modes that are used extensively in present DRAMs and micro-processors to initialize or precondition a chip. An IPL test mode can be used to enable and test the relative delay between an ideal reference driver, that is a reference driver that is known good, and the driver under load, that is, the actual OCD in use.

Figure 1A:
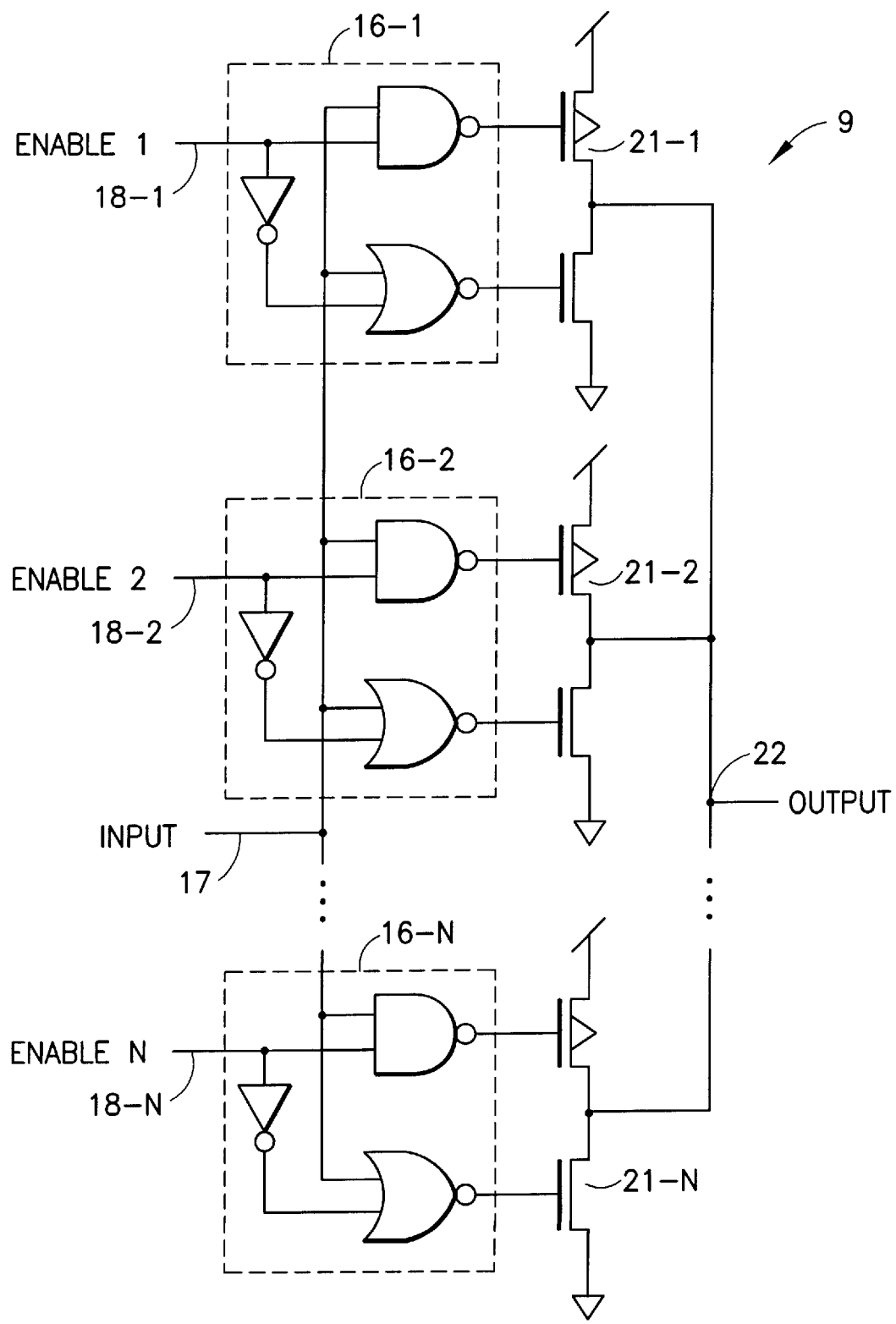
FIG. 1a is a schematic illustration of an embodiment of an OCD driver circuit according to the principles of the present invention.

FIG. 1a shows an off chip driver (OCD) 9 composed of output stages 21-1, 21-2, ... 21-N. Each Output stage 21-1 ... 21-N can be selected by logic 16-1 ... 16-N respectively.

For example, OCD 21-1 is selected by logic 16-1, and OCD 21-N is selected by logic 16-N. The logic is activated by enable signals from the circuits shown in FIG. 1d. The outputs of all the OCD output stages are connected in parallel at output mode 22. Each OCD stage can be "on" or "off" independently of any other OCD stage. Input 17 is one input to the logic stages 16-1 ... 16-N, the other is an enable signal, such as enable N, also referred to as 18-N.1 The enable signals determine the number of OCD stages which may be activated by input 17. If the enable 1 (also referred to as 18-1) voltage is low, then the NAND gate portion of 16-1 will present a high output voltage to the PMOS input gate of OCD 21-1, regardless of the input 17 signal, and the PMOS portion of the OCD will remain in the "off" state. Also, with enable 1 voltage low, the output of the NOR gate portion of gate 16-1 will be a low voltage to the NMOS input gate of OCD 21-1, and it also will be in the "off" state, regardless of the voltage applied to the input 17. This example applies to all logic 16 elements (16-1 to 16-N). Conversely, if any enable line is at a high voltage, the corresponding OCD is enabled. If a low voltage is applied to input 17, then the NAND and NOR gates will be such that NMOS 21 will be "on" with PMOS 21 "off", and if input 17 is a high voltage, then a PMOS 21 will be "on" with NMOS 21 "off".

Figure 1B:
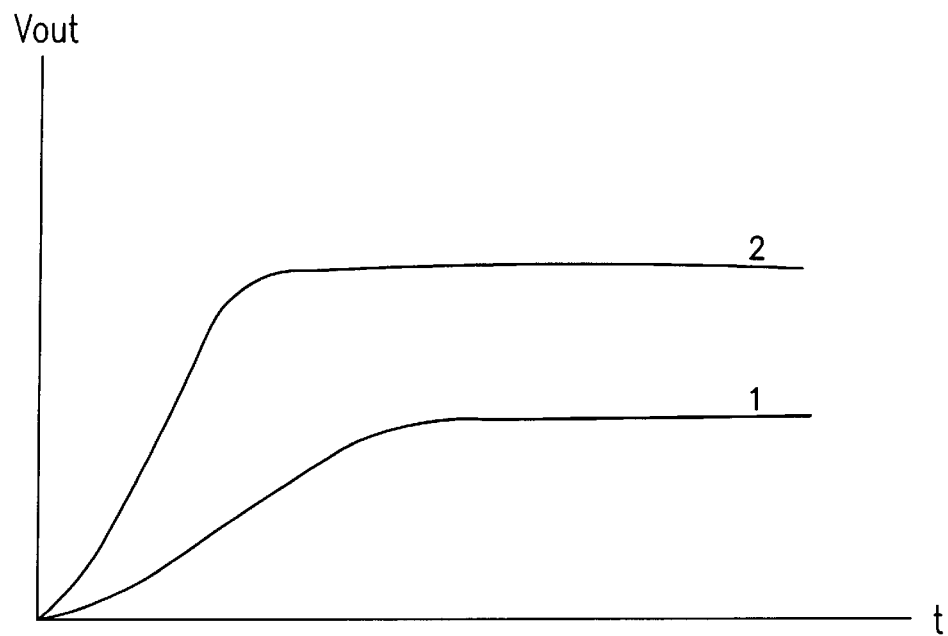
FIG. 1b is an illustration of output voltage for two different driver conditions of the circuit of FIG. 1.

FIG. 1b shows two output voltages V out at node 22 for different driver conditions. Curve 1 shows only one (or a few drivers) active. Curve 2 shows still more (perhaps all) drivers selected with the fastest rise time. For high performance operation, and even for lower performance/lower power operation, the most important portion of the waveform to be controlled is the rise time (or slope).

Figure 1C:
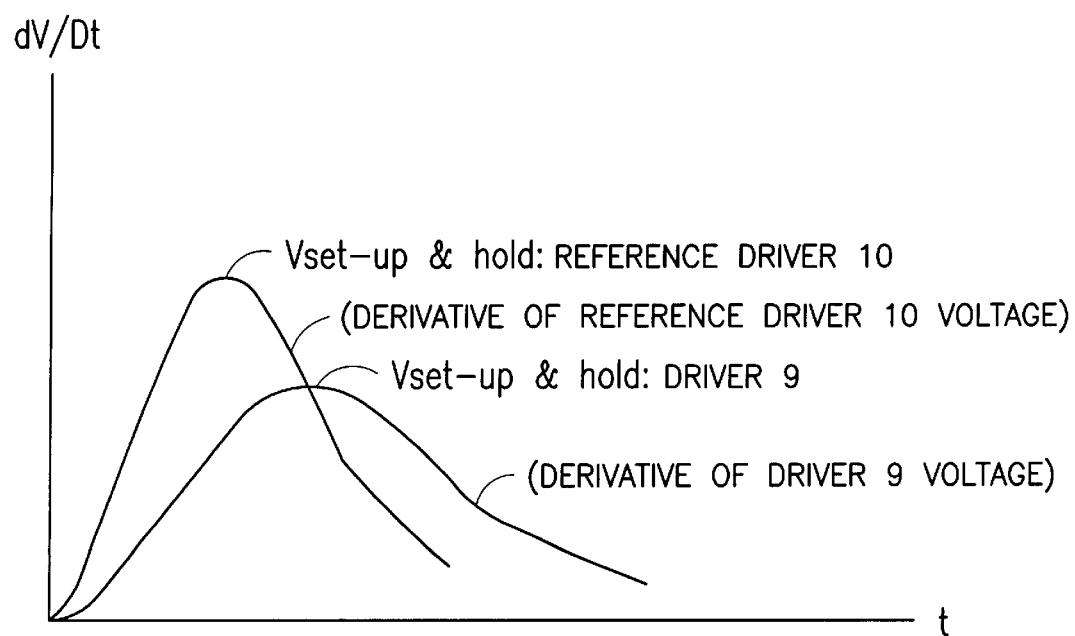
FIG. 1c is an illustration of the derivative of the output voltage of the OCD circuit.
Figure 1D:
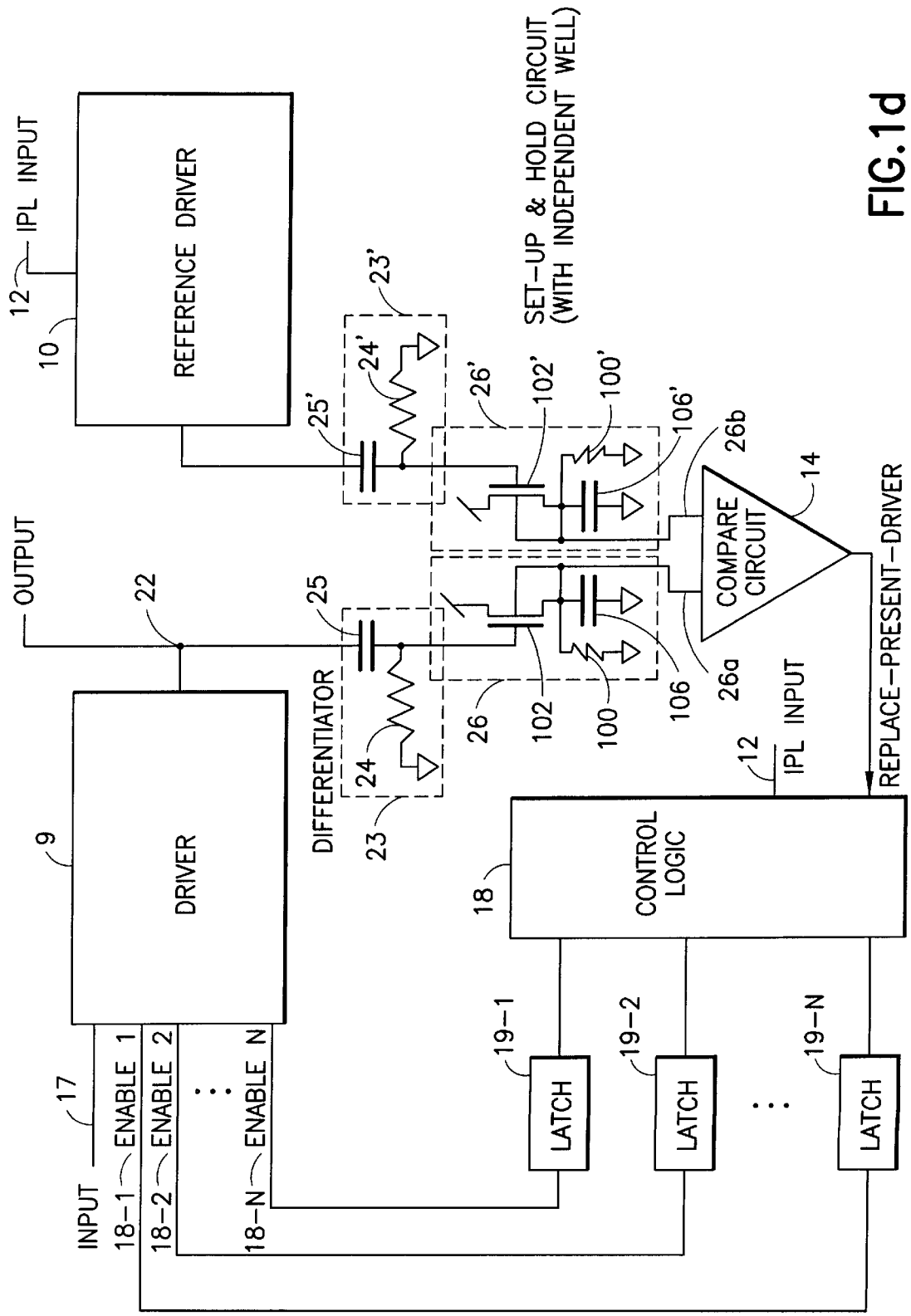
FIG. 1d is a schematic illustration of a reference OCD driver circuit.

The rate of change of the output waveform may be obtained as the first derivative of the output voltage V out as shown in FIG. 1c. A voltage proportional to the peak of the derivative of the output waveform maybe obtained using a set-up and hold circuit. This voltage, V set-up and hold is proportional to the rate of change of the V out, the portion of the waveform to be controlled (V set-up & hold=dV/dtmas−Vth). Referring to FIG. 1d, a "known good" reference off-chip driver circuit 10 is shown having in IPL input signal on lead 12 and an output lead connected as an input to differentiator circuit 23', consisting of capacitor 25' and resistor 24'. This will produce a waveform similar to that shown in FIG. 1c. The output of the differentiator drives transistor 102' of set-up and hold circuit 26'. Transistor 102' is in a well which is connected to capacitor 106' so that the well voltage may rise with the source voltage of transistor 102' as to minimize the Vth of the device. The capacitor will store a voltage close to the maximum value of the differentiator 23' output voltage (voltage one Vth below the maximum) and will apply this voltage to terminal 26b of comparator 14. The capacitor only needs to hold the data until comparator 14 (details shown in FIG. 2) has completed the comparison and lated the result. It is then necessary for the capacitor 106' to be discharged by resistor 100' to be ready for the next reference signal to be compared. The resistor shown is selected to be sufficiently large so that the maximum (or near maximum) value of the differentiated reference driver waveform is successfully latched in comparator 14, and sufficiently small to allow the discharge of capacitor 26' prior to the next compare cycle. Resistor 100' may be replaced with transistor restore devices to precondition the node. The control logic 18 controls the state of latches 19, whose output 18 provide the enable logic signals to driver 9, thus determining the strength of the driver output a t node 22. As was done with the reference driver, the driver output voltage is also differentiated using differentiator circuit 23 consisting of capacitor 25 and resistor 24. The output goes to set-up an d hold circuit 26, which consists of transistor 102, capacitor 106 and resistor 100, which operates as described for circuit 26'. The output driver compare circuit 14 is connected to output leads 26a and 26b from set-up and hold circuit 26.

Comparator 14 sends an output signal to control logic 18 calling for more output from Driver 9 until the output matches the reference driver 10 output. For example, in FIG. 1c, the derivative waveform 2 of reference driver 10 has a higher amplitude than the derivative waveform 1 of driver 9. Logic circuit 18 will set more latches 19, which will activate more Enable lines of 18-1 through 18-n, operating more logic gates 16, which enables more OCD 21 output devices until the waveforms 1 and 2 of FIG. 1c match. The replace-present-driver signal will then go from a positive voltage to ground, indicating sufficient drive capability has been achieved.

Figure 2:
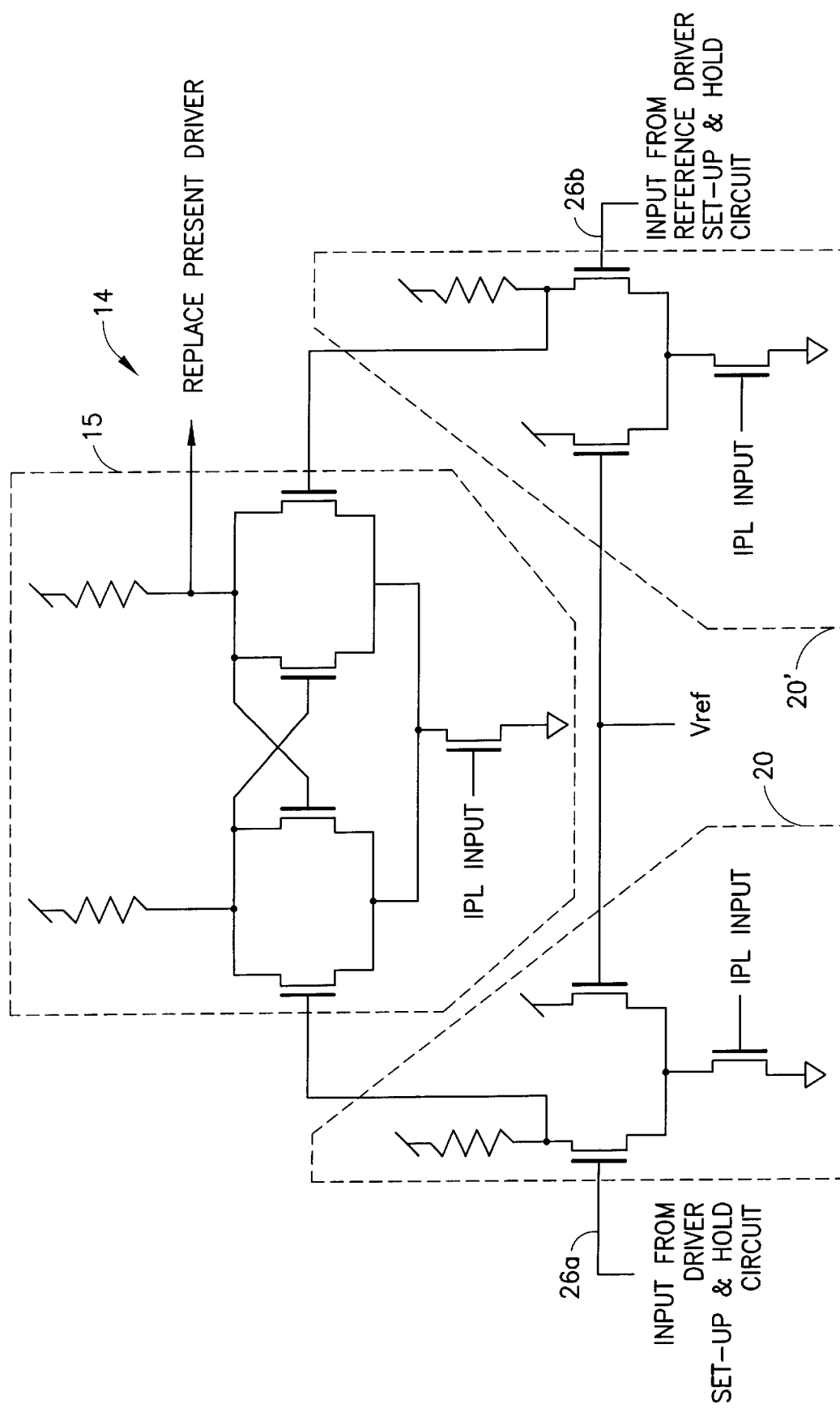
FIG. 2 is a schematic illustration showing the comparison circuit of FIG. 1d in more detail.

FIG. 2 shows one example of a comparator circuit 14 with a latch 15. Circuit 14 provides a standard compare and latch function. The reference driver 10, set-up and hold input 26b go to one side of a comparator/amplifier 20' which compares the input with a reference voltage Vref. The driver 9, set-up and hold input 26a go to the other side of a comparator/amplifier 20. The respective outputs of 20 and 20' go to latch 15. If the amplitude of the output on lead 26b is greater than the amplitude of the output on lead 26a, then the amplitude of the signal from 20' is greater than the amplitude of the signal 20 and from, then the output voltage will be low, which will turn the corresponding latch transistor "off", and the output of comparator latch 15 (i.e. the Replace Present Driver signal) will be at a high voltage. Once the amplitude on lead 26a exceeds the amplitude on lead 26b, then the amplitude of the signal from 20 is greater than the amplitude of the signal from 20' and the output of 15 will go to a low voltage and the desired output voltage rate of change will have been achieved.

In FIG. 1c, if the V set-up & hold curve of the driver 9 rise time is compared against the V set-up & hold curve of the ideal reference driver rise time 10, and the results fed back to the circuit of FIG. 1d indicates a lower rate of rise, then the OCD has aged. This is indicated if the replace-present-driver signal from 14 is high. Logic circuit 18 can then initiate a modification of the driver 9 by adding one or more stages to increase the rise time (performance) of the OCD using the techniques described earlier for FIGS. 1a1, 1b, 1c, 1d, and FIG. 2. The time of comparison is arbitrary. For example, the system clock for the chip can be used to trigger an internal IPL test mode when the chip is not is use. An alternate technique would be to compare the driver (OCD) to the reference driver 10 each time the chip is powered. It is important to note that the ideal reference driver 10 is unaged, as it has been disconnected for all timet beyond zero. If the Driver 10 has also not aged, then the replace-present-driver signal will be a low voltage, and logic circuit 18 will not adjust the OCD.

The previously described circuits of FIGS. 1a, 1d, and 2 utilize IPL modes to set the driver strength on a one time basis. In the next embodiment of FIG. 3, the driver strength is continuously sampled and stages are added (or conversely may be subtracted) to add (or delete) drive strength from the circuit of FIG. 1a as needed.

Figure 3:
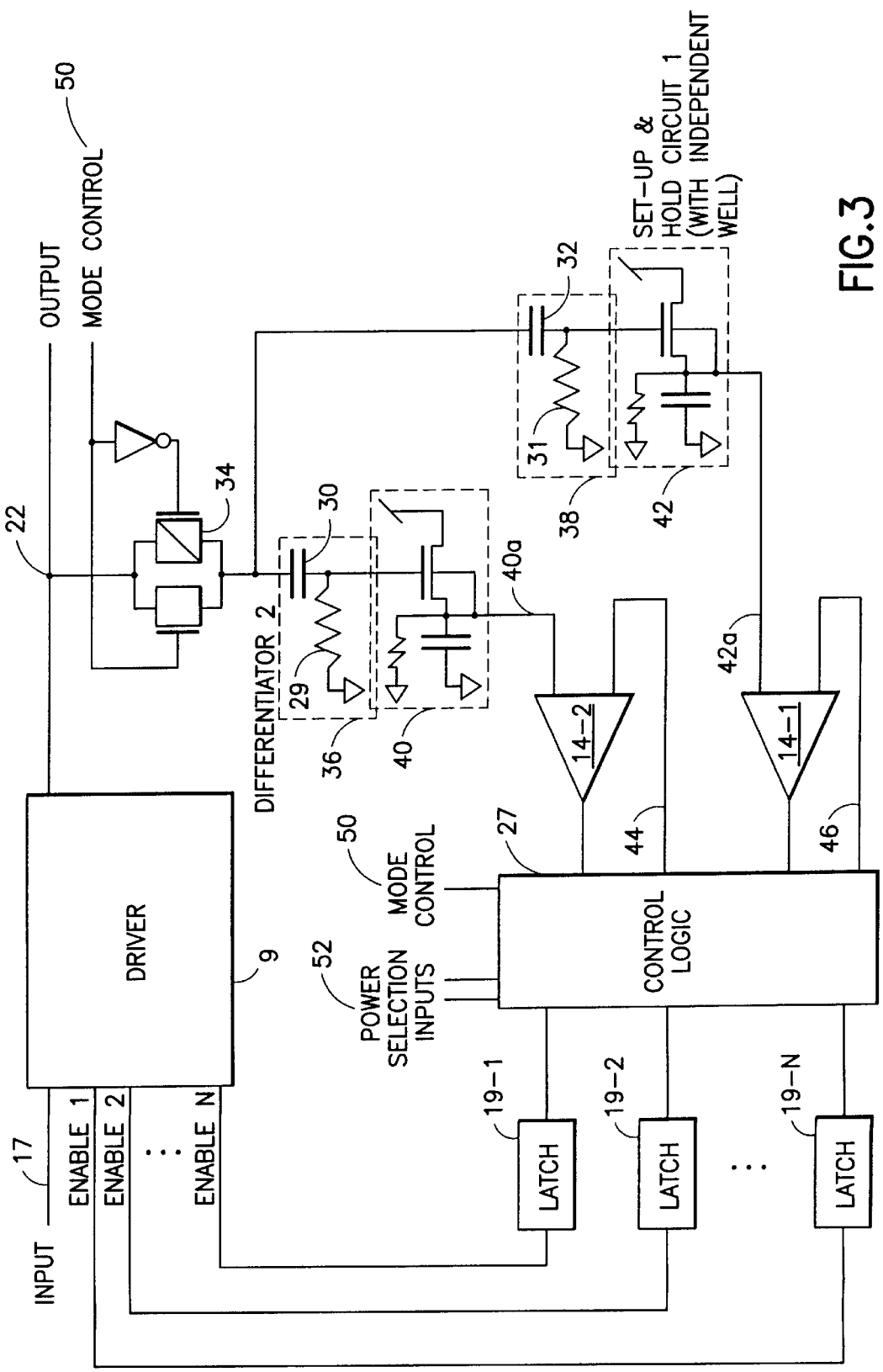
FIG. 3 is a schematic illustration showing another embodiment of an OCD circuit according to the principles of the present invention.

For example, operating temperature or changing power supply in a portable system application may trigger the need for a varying driver configuration. Referring to FIG. 3, an embodiment comprising "on" driver stages is shown to be available based on system load. Stages are latched into (or out of) the system based on an edge triggered response to the sampled load at each successive stage. This mode of operation is activated by mode control 50. The power selection inputs 52 define the operating range options such as low power (lower performance) and high power (high performance). Many intermediate states may be defined.

Power selection inputs 52 may represent a low power state. The speed of driver 9 is sampled using sampling device 34. Differentiators 36 and 38 supply two different slopes to set-up & hold circuits 40 and 42 with outputs 40a and 42a, fed to compare circuits 14-1, and 14-2. Control logic 27 has reference signal 44 and compare signal 46 fed back to the latches. The output signal on 22 may vary between two rise times and still be in the low power range. For example, control logic 27 may increase the number of selected latches 19 until the output of compare circuit 14-1 goes from positive to zero, and operate at the minimum power level. Control logic 27 may also increase output 22 drive until the compare circuit 14-2 output is zero, in which case the OCD are operating at the maximum power consistent with operation in the low power mode.

Power selection inputs 52 may select the highest power mode. In this case, control logic may select the maximum rate of rise (maximum power) for the output at 22. In this case the outputs of both 14-2 and 14-1 would be at ground. The circuits may operate at a lower power level, still within the high power band, with 14-2 having a positive output and 14-1 having a grounded output voltage to control logic 27. The parallel NFET/PFET device 34 connected to the output 22 can be set to continuous poling, or the poling may be disconnected, when the actual driver is in a receive mode (for example, in a bi-directional application).

Figure 4:
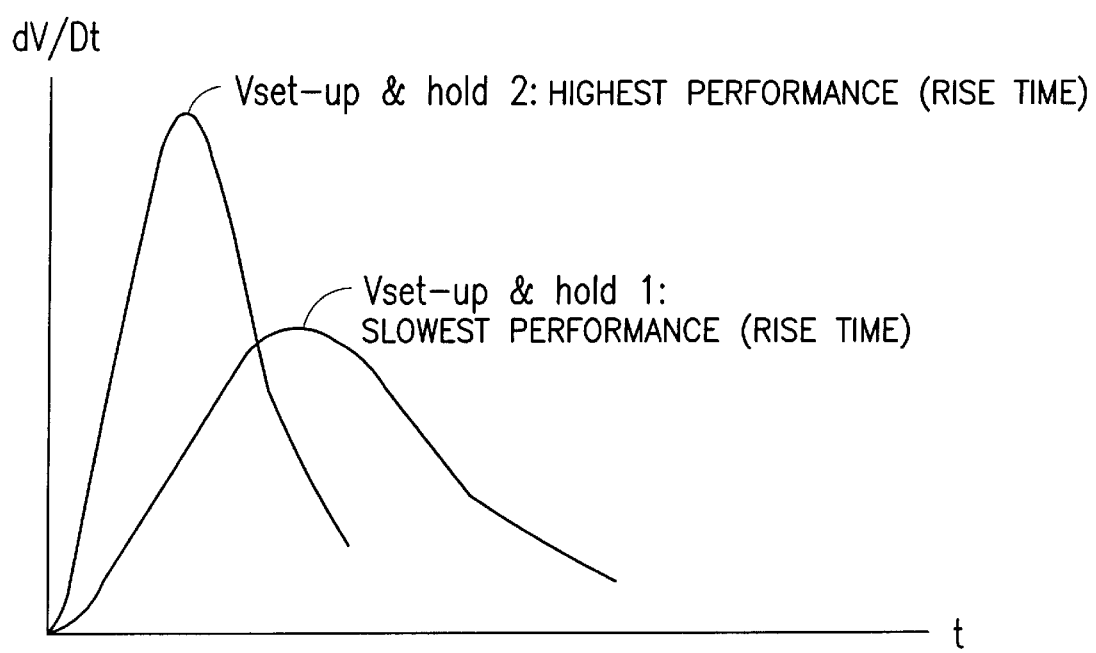
FIG. 4 is an illustration of performance curves for the highest and lowest performance for the OCD circuit of the present invention.

FIG. 4 shows the higher and lower values of the set-up & hold voltages for Highest and Lowest Performance (rise time) operation as discussed with respect to FIG. 3.

In order to continuously monitor and replace degrading circuit elements such as transistors, it is desirable to be able to monitor both the rising and the falling transitions of the OCD. It is well known that MOSFET wearout has a different tendency for NMOS and PMOS devices. NMOS devices generally exhibit a positive change in threshold voltage, and tend to become weaker transistors over time. PMOS devices behave opposite to the NMOS devices. The PMOS threshold voltage becomes more positive with time, but since it's initial threshold voltage is negative, the PMOS device speed will increase over time. An additional layer may be added to the operation of FIG. 3 to handle both NFET and PFET device degradation.

Since NFET devices weaken, NFETs will be added in parallel to the driver until the rise time meets the sampled criteria, as illustrated in FIG. 4. PFET devices will be removed and replaced since they will tend to degrade circuit performance.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A circuit for determining the state of an off-chip driver circuit output signal comprising:

an off-chip driver circuit including a reference driver circuit for providing a reference signal, a circuit having a plurality of separate driver circuit paths having first inputs connected to an input signal and outputs connected to an output line at a common node to provide output driver signals to the common node;

a logic circuit connected to the common node and to the reference signal from the reference driver circuit and responsive to the output signal thereon to determine the operating state of the off-chip driver circuit, the logic circuit including latch circuits for adding and removing selected ones of the separate driver circuit paths in response the operating state of the off-chip driver circuit.

2. The circuit of claim 1 wherein a transistor device is connected between the common node and the logic circuit for continuously monitoring the off-chip driver circuit output signal.

3. The circuit of claim 2 wherein the transistor device monitors the rising and falling of the level of off-chip driver output signal.

4. A circuit for determining the state of an off-chip driver circuit output signal comprising:

a first off-chip driver circuit having an input connected to an initial program logic signal for providing a reference off-chip driver output signal;

a comparator circuit having first and second inputs, the first input being connected to the reference off-chip driver output signal of the first off-chip driver circuit;

a second off-chip driver circuit including a plurality of separate driver circuit paths having inputs connected to the initial program logic signal and outputs connected to a common node to provide output driver signals to the common node, wherein the common node is connected to the second input of the comparator circuit for comparison with the reference off-chip driver output signal from the first off-chip driver circuit to determine the operating state of the second off-chip driver circuit with respect to the operating state of the first off-chip driver circuit.

5. The circuit of claim 4 further including a delay circuit connected between the outputs of the plurality of separate driver paths of the second off-chip driver circuit at the common node and the second input of the comparator circuit.

6. The circuit of claim 5 further including a logic circuit connected to the output of the comparator circuit and to inputs of the separate driver circuit paths of the second off-chip driver circuit to provide a signal in response to the operating state of the second off-chip driver circuit indicated by the comparison signal.

7. The circuit of claim 6 wherein logic circuit includes a plurality of latch circuits connected to the inputs of the plurality of separate driver circuit paths to provide signals to add or remove one or more of the separate driver circuit paths from the second off-chip driver circuit in accordance with the operating state of the second off-chip driver circuit.

* * * * *